United States Patent
Birkner et al.

(10) Patent No.: US 6,962,471 B2
(45) Date of Patent: Nov. 8, 2005

(54) SUBSTRATE CONVEYING MODULE AND SYSTEM MADE UP OF SUBSTRATE CONVEYING MODULE AND WORKSTATION

(75) Inventors: Andreas Birkner, Jena (DE); Knut Hiltawski, Saalfeld (DE); Karsten Urban, Jena (DE); Joachim Wienecke, Jena (DE)

(73) Assignee: Leica Microsystems Jena GmbH, Jena (DE)

(*) Notice: Subject to any disclaimer, the term of this patent is extended or adjusted under 35 U.S.C. 154(b) by 0 days.

(21) Appl. No.: 09/880,100

(22) Filed: Jun. 14, 2001

(65) Prior Publication Data

US 2002/0051698 A1 May 2, 2002

Related U.S. Application Data

(60) Provisional application No. 60/243,016, filed on Oct. 26, 2000.

(30) Foreign Application Priority Data

Oct. 26, 2000 (DE) .............................. 100 53 232

(51) Int. Cl.[7] ............................................ H01L 21/68
(52) U.S. Cl. .................................. 414/217; 414/217.1
(58) Field of Search ............................. 414/217, 217.1

(56) References Cited

U.S. PATENT DOCUMENTS

| | | | | |
|---|---|---|---|---|
| 4,825,808 A | * | 5/1989 | Takahashi et al. | 118/719 |
| 4,917,556 A | * | 4/1990 | Stark et al. | 414/217 |
| 5,399,531 A | | 3/1995 | Wu | 437/205 |
| 5,651,868 A | * | 7/1997 | Canady et al. | 204/298.25 |
| 5,733,024 A | * | 3/1998 | Slocum et al. | 312/223.2 |
| 5,769,952 A | * | 6/1998 | Komino | 118/733 |
| 5,842,824 A | | 12/1998 | Nishi | 414/225 |
| 5,865,588 A | * | 2/1999 | Schertler | 414/217 |
| 6,178,361 B1 | * | 1/2001 | George et al. | 700/213 |
| 6,235,634 B1 | * | 5/2001 | White et al. | 438/680 |
| 6,298,685 B1 | * | 10/2001 | Tepman | 62/378 |
| 6,326,755 B1 | * | 12/2001 | Babbs et al. | 318/568.21 |
| 6,440,261 B1 | * | 8/2002 | Tepman et al. | 118/715 |
| 6,520,727 B1 | * | 2/2003 | Babbs et al. | 414/217 |

* cited by examiner

Primary Examiner—Thomas J. Brahan
(74) Attorney, Agent, or Firm—Foley & Lardner LLP

(57) ABSTRACT

The invention is based on a substrate conveying module (1) for conveying substrates into a workstation (3) for inspection, measurement, or processing of the substrates, in which on because of connecting elements (4a, b) in at least two side walls (1a, b, c) of the substrate conveying module (1) and/or in at least two side walls (3a, b, c, d) of the workstation (3), the substrate conveying module (1) can, at the installation location of the workstation (3), be flexibly connected thereto in different orientations with respect to the workstation (3) and/or can be coupled at different points to the workstation (3).

11 Claims, 4 Drawing Sheets

SUBSTRATE CONVEYING MODULE AND SYSTEM MADE UP OF SUBSTRATE CONVEYING MODULE AND WORKSTATION

CROSS REFERENCE TO RELATED APPLICATIONS

This invention claims priority of both a German filed application DE 100 53 232.2 and an American filed application 60/243,016 filed Oct. 26, 2000, which are incorporated by reference herein.

FIELD OF THE INVENTION

The invention is based on a substrate conveying module for conveying substrates into a workstation, and a system made up of a substrate conveying module and workstation.

BACKGROUND OF THE INVENTION

Substrate conveying modules of this kind are known in particular in the semiconductor industry. The substrates used therein are on the one hand disk-shaped wafers that are usually made of silicon or gallium arsenide. Substrates can, however, also be masks, i.e. glass plates on which patterns have been or are applied, and which serve as originals for exposing wafers.

In the production of semiconductor wafers, between certain production steps the substrates are transported, in cassettes of various kinds, to different workstations and must there be inserted into the respective workstation. Transport can be accomplished manually or automatically.

The workstations serve various purposes for treatment of the substrates, such as inspection, measurement, or processing of the substrates. During inspection of the particles on the substrates, or defects in the patterns on or in the surface of the substrates. Inspection can be accomplished by the user, or automatically by way of an electronic camera. In these or in separate workstations, measurements can also be performed on the substrates. For example, the unwanted particles or pattern defects can be automatically detected and classified (defect analysis). The widths, spacings, or thicknesses of the patterns can furthermore be measured (CD analysis, layer thickness analysis). Because the objects being investigated are small, microscopes are usually used for these inspection and measurement applications in such workstations. In addition, macro-scale inspection of the substrates is possible; in this, the entire substrate is visually observed under light at a specific angle of incidence, so that scratches, resist defects, or dirt particles can be detected very quickly. The inspection and measurement procedures are often fully automated, both in terms of handling of the substrates and as regards the locations on the substrate to be inspected or measured.

In other workstations, the substrates are processed, e.g. patterns are generated by depositing specific substances or by way of etching operations, or resists are applied for exposure.

Other usual criteria for such workstations and substrate conveying modules are high reliability and ease of use. They should require only a small floor space ("footprint") in the valuable clean-room space in the manufacturing facility.

In particular, however, they should be designed so they are easy and simple to maintain. At the same time, stringent requirements are imposed on the handling of the substrates, for example in terms of handling reliability, speed, and cleanliness. In addition, it should also be possible for substrates of different diameters to be used and to be introduced into the handling system. In this context, "handling" of the substrates means transferring the substrates from the substrate conveying module into the workstation, and changes in location within the workstation and lastly back out into the substrate conveying module, optionally with appropriate sorting.

In order to meet these many and stringent requirements, existing substrate conveying modules and workstations are immovably connected to one another from the outset, and are supplied to the semiconductor manufacturer as a unit. In this context, the semiconductor manufacturer must indicate from the outset the point on the workstation—i.e. on the left or right side or at the rear of the workstation—at which the substrate conveying module is to be installed and connected. The orientation of the substrate conveying module with respect to the workstation must also be predefined. This determines the point on the substrate conveying module at which the latter can be loaded with the substrate cassettes. The future user must therefore indicate in advance the particular side of the substrate conveying module on which the loading of substrates from outside is to be accomplished.

As an alternative to complete prefabrication, it is also possible for installation of the substrate conveying module and individual modules of the workstation to be delayed until they are within the manufacturing facility, and performed by the semiconductor manufacturer. In this case as well, however, a decision must be made from the outset as to the arrangement in which the substrate conveying module is to be combined with the workstation, i.e. at what point and with what orientation the substrate conveying module is to be coupled to the workstation.

U.S. Pat. No. 5,399,531 discloses a manufacturing system for semiconductor wafers in which a plurality of process stations is connected to a permanently defined, branched transport system for the wafers that has load zones and unload zones.

U.S. Pat. No. 5,842,824 describes a substrate transport apparatus for an exposure device in which a substrate supported in a vertical orientation is transported along a path and, after the substrate has been changed into a horizontal position, the substrate is brought via a pre-alignment mechanism onto a substrate stage. No provision is made for a flexibly modifiable arrangement of the substrate transport apparatus with respect to the pre-alignment mechanism with substrate stage.

SUMMARY OF THE INVENTION

It is the object of the invention to describe a substrate conveying module, or a system made up of a substrate conveying module and a workstation, which makes possible an orientation of the substrate conveying module with respect to a side wall of the workstation that is flexible at the installation location, and/or an overall arrangement of the substrate conveying module and workstation that is flexible at the installation location.

The object is achieved by way of the features of the embodiments described herein below.

The advantageous result of connecting elements mounted on the substrate conveying module on at least two side walls is that a decision as to the orientation or rotational alignment in which the substrate conveying module is to be installed on the workstation does not need to be made until shortly before assembly of the substrate conveying module and workstation at the installation location. The substrate conveying module can therefore be rotated, on short notice and on-site, into a rotational position possibly different from the one that may originally have been planned, and installed on the workstation. Conventional setup, planned in detail from the outset, can be dispensed with.

By way of the connecting elements mounted on the workstation on at least two side walls, it is similarly possible to couple the substrate conveying module to the workstation at at least two different locations. If, moreover, at least two side walls on both the substrate conveying module and the workstation are respectively equipped with corresponding connecting elements, then both the rotational alignment and the coupling point of the substrate conveying module onto the workstation can be selected without restriction during installation on-site. This flexibility during setup of the two devices is very advantageous for the user of the equipment, since he or she need not define, quite some time earlier when the order is entered, the arrangement and orientation of the substrate conveying module and workstation. In addition, this flexibility simplifies the equipment logistics upon delivery to the customer.

In addition, the substrate conveying module according to the present invention, or a system made up of one or more substrate conveying modules and one or more workstations according to the present invention, has the advantage that its arrangement is also flexibly modifiable during its service life. Trained persons are capable at any time of making a configuration change and readapting the substrate conveying module and workstation to changes in circumstances. If necessary, for example, substrate conveying that was previously being performed laterally into the workstation can be converted, without substantial effort, into substrate conveying that occurs from the rear side.

A further advantage that results is great ease of maintenance, since the substrate conveying module and the workstation can easily be separated. This allows maintenance personnel quick and easy access to the internal equipment components.

The connecting elements in the side walls of the substrate conveying module and the workstation are generally kinematic couplings known to those skilled in the art. The term "kinematic couplings" is understood to mean mechanical apparatuses which make it possible to couple together mechanical assemblies or modules, and in that context, by way of mechanical apparatuses, to align them with respect to one another with as many degrees of freedom as possible or allow them to assume a previously aligned orientation. These mechanical apparatuses can be, for example:

- a pin on one module that encounters a hole or elongated hole on the other module;
- a pin on one module that encounters a plate on the other module (stop).

In this context, the pins can assume various forms. They can be of cylindrical, conical, or tapered configuration, and the ends of the pins can be pointed, rounded, or spherical. The receiving mechanisms of the opposing module must be configured in accordance with these various embodiments of the pins. Upon assembly of the modules, not only are the pins received by the receiving mechanisms for an immovable connection between the modules, but at the same time the two modules are automatically aligned with one another by way of the corresponding fits.

Kinematic couplings of this kind are mounted at suitable locations on the substrate conveying module and at suitable locations on the workstation; corresponding flexibility in the orientation of the substrate conveying module with respect to the workstation, according to the present invention at least two sides of the substrate conveying module are equipped with these kinematic couplings. For flexible arrangements of the substrate conveying module on the workstation, for example arrangement on the front, side, or rear, at least two sides of the workstation are equipped with the kinematic couplings. For complete flexibility of orientation and arrangement, all sides of the substrate conveying module and of the workstation are correspondingly fitted with the kinematic couplings.

The substrate conveying module and the workstation can advantageously be configured in such a way that at least for two adjoining sides of the workstation and/or in the context of any orientation of the substrate conveying module, the transfer of substrates is accomplished only at a single point. As a result, the internal configuration of the workstation is independent of the arrangement and/or orientation of the substrate conveying module. In addition, even different substrate sizes can thus easily be transported without previous modifications.

Furthermore, of course, it is also possible to couple several substrate conveying modules and several workstations to one another to form an overall system. The advantages of the invention thus consist in the creation of a flexible, modular system that makes possible, in simple fashion, different orientations and arrangements of substrate conveying modules and workstations for the often rapidly changing needs of a semiconductor plant with regard to the setup of its processing and metrology equipment.

BRIEF DESCRIPTION OF THE DRAWINGS

The invention will be explained in more detail below with reference to the exemplary embodiments depicted in the drawings, in which, schematically in each case.

DETAILED DESCRIPTION OF THE INVENTION

Figure 1:
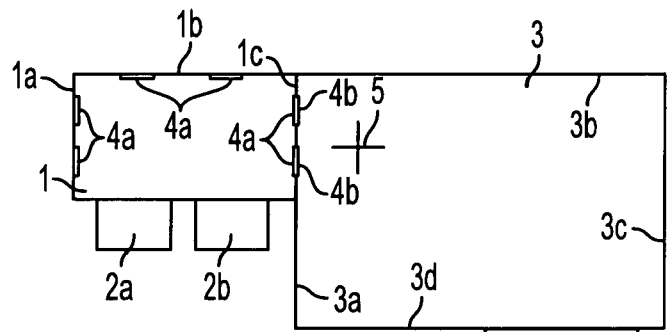
FIG. 1 shows an arrangement of a substrate conveying module on the side of a workstation, with front-side loading.

FIG. 1 shows, in schematic fashion, an arrangement of a substrate conveying module 1 on the side of a workstation 3. Workstation 3 generally possesses an operating interface 6 by way of which a user can make inputs for the control system and procedures of workstation 3. Operating interface 6 can be corresponding switches, knobs, or a keyboard, with which a connected electronic system or a computer can be operated and workstation 3 can thereby be controlled. Operating interface 6 defines the front side of workstation 3 or of the system made up of substrate conveying module 1 and workstation 3.

In this exemplary embodiment, substrate conveying module 1 is oriented with respect to workstation 3 in such a way that it can be loaded with substrates from the front side through its load ports 2a, 2b. Normally two load ports 2a, 2b are provided. In this context, cassettes of open or closed configuration are used, which are introduced into load ports 2a, 2b either manually by the user or by automation, e.g. by way of a robot. The cassettes can be filled with substrates or can also be empty, depending on the working procedure provided for. For example, all the cassettes can be filled, and the substrates are first removed from the one cassette, introduced into workstation 3 and, after treatment there, put back into the same cassette. This operation then repeats for the next cassette, while the user retrieves the cassette with the processed substrates and in its place introduces a new cassette with substrates into the unoccupied load port 2a, 2b.

On the other hand, the substrates can also be removed from the one cassette and, after passing through workstation 3, sorted into the other, initially empty cassette. It is self-evident in general, in this context, that instead of two load ports 2a, 2b, only a single load port 2a, 2b or also three or more load ports 2a, 2b can be provided.

Substrate conveying module 1 and workstation 3 are interconnected by way of mechanical connecting elements 4a, b. Connecting elements 4a, b create a variable but nonetheless precise connection. The connection must be precise so that transfer of the substrates between substrate conveying module 1 and workstation 3 can be accomplished smoothly and quickly. Advantageously, a fixed transition point 5 is provided within workstation 3 for the transfer of substrates. A precise connection with connecting elements 4a, b thus also makes possible a precise transfer. Connecting elements 4a, b that are used are preferably kinematic couplings known in the art, which effect automatic alignment when substrate conveying module 1 and workstation 3 are assembled. Maintenance is considerably simplified as a result of the easy detachability and reproducible, precise recoupling of substrate conveying module 1 and workstation 3 by way of connecting elements 4a, b.

Figure 2:
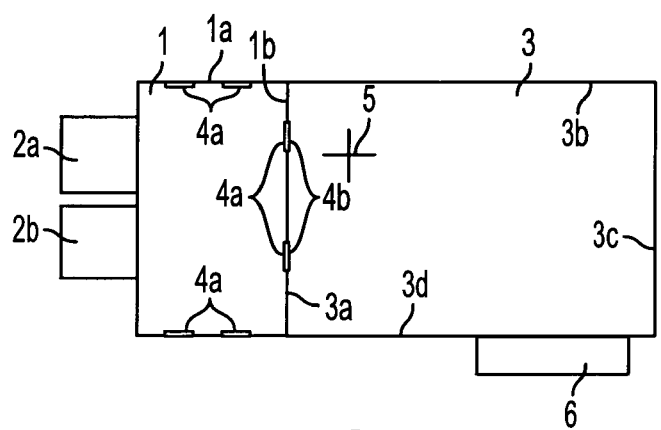
FIG. 2 shows an arrangement like FIG. 1, but with side loading.

According to the present invention, connecting elements 4a, b of this kind are provided on at least two side walls 1a, b, c of substrate module 1 and/or on at least two side walls 3a, b, c, d of workstation 3. This makes possible a variable orientation and arrangement of substrate conveying module 1 and workstation 3, so that decisions about orientation and arrangement need not be made until they are set up. In addition, the configuration of substrate conveying module 1 and workstation 3 can at any time be modified without great effort and adapted to new or modified space-related circumstances, so that the same system made up of substrate conveying module 1 and workstation 3 can be reused. In this context, the precision of connecting elements 4a, b brings about a reproducible transfer of the substrates. Advantageously, one and the same transfer point 5 in workstation 3 is used in this context. The great flexibility of the system made up of substrate conveying module 1 and workstation 3 is illustrated by the following Figures. FIG. 2 schematically shows a coupling of substrate conveying module 1 to workstation 3 in which substrate conveying module 1, rotated 90° as compared to FIG. 1, is coupled to the same side of workstation 3. Load ports 2a, 2b are thus arranged laterally, and the user operates substrate conveying module 1 from the side.

Figure 3:
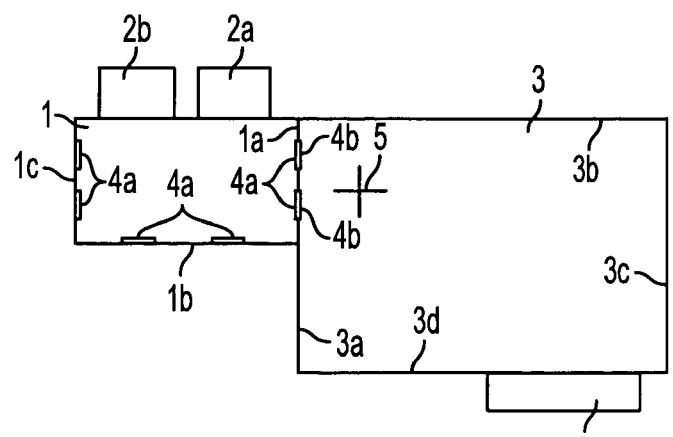
FIG. 3 shows an arrangement like FIG. 1, but with rear-side loading.

As shown in FIG. 3, substrate conveying module 1 can once again be connected to the same side of workstation 3, although it is loaded with the cassettes from the rear side. As shown by FIGS. 1 through 3, the user can thus select, on-site, whether he or she wishes to load substrate module 1 from the front, from the side, or from the rear, substrate conveying module 1 being installable on the same side 3a of workstation 3. Or the user can perform a corresponding reconfiguration at a later time. This flexibility is achieved by the mounting of connecting elements 4a, b on several sides of substrate conveying module 1. The transport system for the substrates within substrate conveying module 1 is correspondingly designed for the various substrate transfer possibilities.

Figure 4:
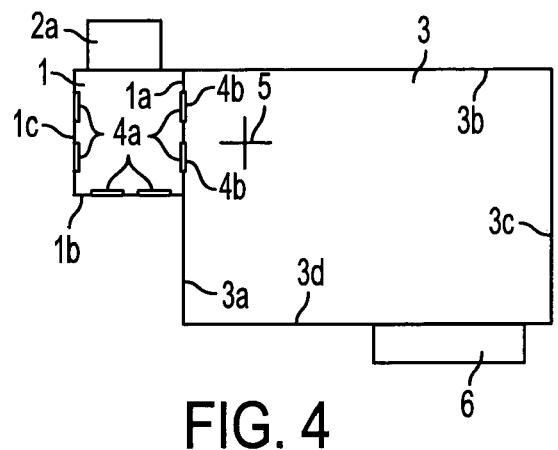
FIG. 4 shows an arrangement like FIG. 1 but with reduced rear-side loading.

As shown in FIG. 4, substrate conveying module 1 can also be equipped with only a single load port 2a, 2b. Here the substrates are removed from and placed back into one and the same cassette. This configuration with a simple sequence saves space and expense in the clean room.

Figure 5:
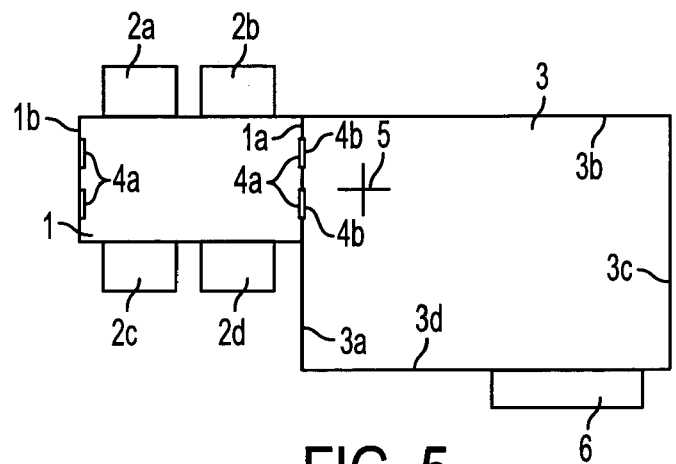
FIG. 5 shows an arrangement like FIG. 1, but with additional rear-side loading.

On the other hand, substrate conveying module 1 can also have more than two load ports 2a, 2b, as shown for example by FIG. 5, in which loading is possible from both the front and the rear. More than two load ports 2a, 2b can, of course, also be provided on only one side. Combinations of the aforementioned arrangements are naturally also possible.

Figure 6:
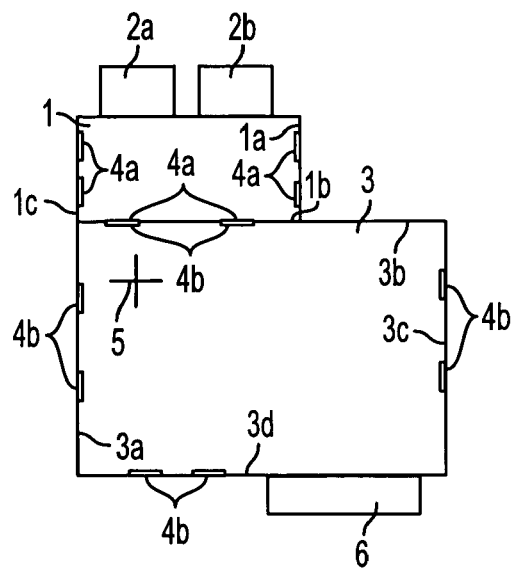
FIG. 6 shows an arrangement of the substrate conveying module on the rear side of the workstation, with rear-side loading.

A further variant of the arrangement between substrate conveying module 1 and workstation 3 is shown in FIG. 6. In this exemplary embodiment, substrate conveying module 1 is connected to rear side 3b of workstation 3. A prerequisite for this is naturally that rear side 3b of workstation 3 be equipped with corresponding connecting elements 4b. In this configuration, left and right sides 3a, c of workstation 3 are unoccupied. As a result, any space requirements can be taken into account, or unoccupied sides 3a, c can be used for other purposes. To ensure a flexible arrangement of the substrate conveying module 1 on different sides 3a, b, c, d of workstation 3, these sides 3a, b, c, d are correspondingly equipped with connecting elements 4b. A specific side 1a, b, c of substrate conveying module 1 can thus be coupled to several sides 3a, b, c, d of workstation 3.

If substrate conveying module 1 is at the same time also fitted on several sides 1a, b, c with connecting elements 4a, the result is to create analogously, for the mounting of substrate conveying module 1 on rear side 3b of workstation 3, the same possibilities for variation that have already been described above and depicted in FIGS. 1 through 5. In particular, more than two load ports 2a, 2b can also be provided on one side 1a, b, c, or in distributed fashion on several sides 1a, b, c of substrate conveying module 1.

In all the examples so far given, provision can also advantageously be made, by way of mutually coordinated designs for substrate conveying module 1 and workstation 3, for transfer point 5 of the substrates to be the same for all configurations. This eliminates any change in the position of transfer point 5 that would otherwise be necessary when configuration changes are made.

Also possible, of course, with all variants of the orientation of substrate conveying module 1 with respect to workstation 3, is a coupling (not depicted in the Figures) of substrate conveying module 1 to the right sides 3c of workstation. In this context, transfer point 5 will generally be located on the right side of workstation 3. Designs are also possible, however, in which only a single apparatus is necessary for transfer point 5, and provides substrate transfer in all possible configurations of substrate conveying module 1 and workstation 3. Transfer point 5 can be located in the center between the left and right side walls of workstation 3, but it can also be arranged asymmetrically.

In principle, substrate conveying module 1 can also be installed on front side 3d of workstation 3, although this is not explicitly shown in the Figures.

Combinations with several workstations 3 and/or with several substrate conveying modules 1 are also possible. The configuration comprising two workstations 3 and one substrate conveying module shown in FIG. 7 may serve on the one hand as a representative and example of such combinations. In this, two identical or different workstations 3 are connected via substrate conveying module 1. The total throughput of substrates can thereby be increased, and processes can be made more effective. For example, after it has been processed in the one workstation 3, a substrate can be introduced by way of substrate conveying module 1 directly into the other workstation 3 (e.g. for inspection of measurement) and then, depending on the result, deposited into the corresponding cassette in one of load ports 2a, 2b, 2c, 2d.

Figure 8:
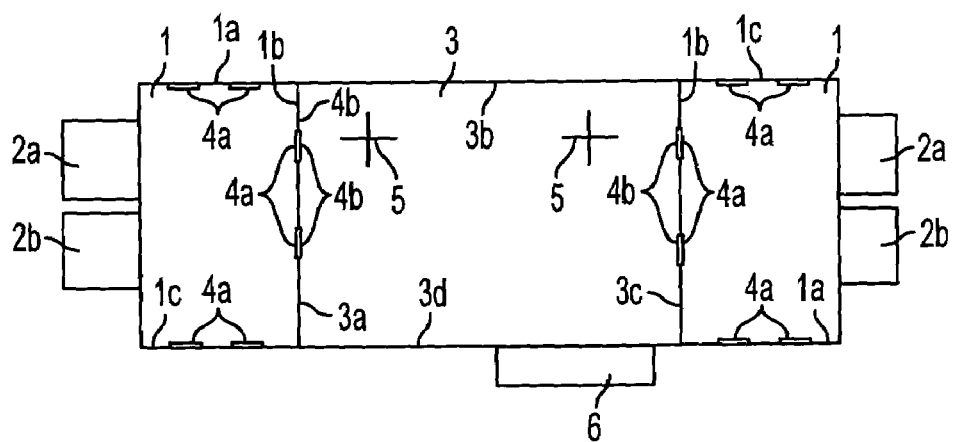
FIG. 8 shows an arrangement of two substrate conveying modules, each with side loading, on either side of a workstation.

FIG. 8, on the other hand, shows a configuration having one workstation 3 and two substrate conveying modules 1. The throughput and effectiveness of the entire process can be increased with this configuration as well. For example, the substrates can be delivered to the left-hand substrate conveying module 1 and, after passing through workstation 3, retrieved again from the right-hand substrate conveying module 1.

Figure 7:
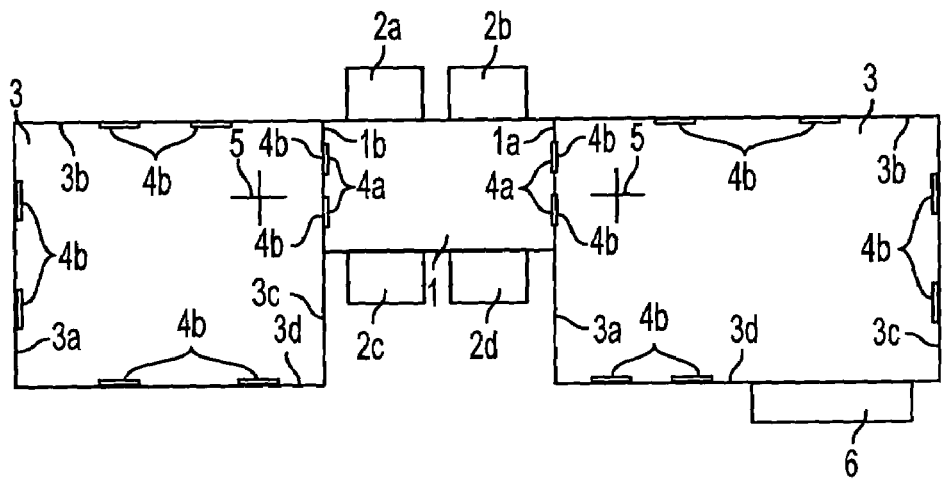
FIG. 7 shows an arrangement of the substrate conveying module between two workstations.

Various orientations and arrangements of substrate conveying module 1 and workstations 3 are also possible with the configurations shown in FIGS. 7 and 8, in a manner similar to that mentioned in the descriptions of the foregoing Figures. The electrical connections between substrate conveying modules 1 and workstation 3 do not stand in the way of this great mechanical flexibility of the arrangements, since the electrical connections may generally be managed very flexibly themselves by way of electrical lines with plug connectors.

In addition, it may be noted that configurations having more than two substrate conveying modules 1 and more than two workstations 3 are of course also possible; as a result, several process steps can be combined in a conglomerate of such machines and put together by the user only on-site in accordance with his or her requirements and space circumstances, or can even be modified later. As a further and not least advantage of the invention, the compact construction reduces the amount of valuable and expensive floor space required in the clean room for semiconductor manufacture.

Figure 9:
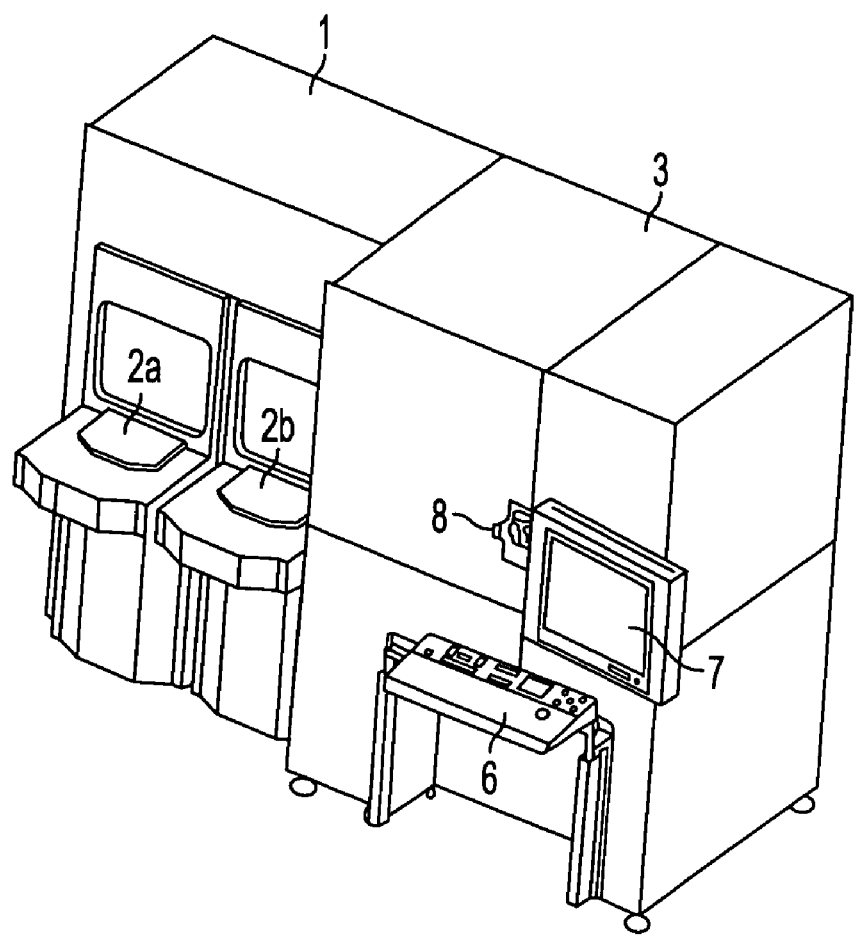
FIG. 9 shows a perspective depiction of the substrate conveying module and the workstation.

FIG. 9 shows, by way of example, a perspective depiction of substrate conveying module 1 and workstation 3 corresponding to the arrangement depicted in FIG. 1. This external overall view additionally shows a screen 7 with which the user can monitor his or her inputs made via operating interface 6, or can track the status of substrate handling or examine results of the working processes in workstation 3, etc. In cases where a camera is installed in workstation 3, images of the substrate can be displayed on screen 7, or the substrate can be observed directly with a microscope or via a microscope viewing port 8.

PARTS LIST

1 Substrate conveying module
1a, b, c Side walls of substrate conveying module
2a, b, c, d Load ports
3 Workstation
3a, b, c, d Side walls of workstation
4a, b Connecting elements
5 Transfer point
6 Operating interface
7 Screen
8 Microscope viewing port

What is claimed is:

1. A system made up of at least one substrate conveying module and at least one workstation which has several side walls, substrates being exchangeable between the substrate conveying module and the workstation, wherein the workstation has, on at least two different side walls, kinematic coupling connecting elements that are directly connected to corresponding kinematic coupling connecting elements on at least one side wall of the substrate conveying module to provide for a connection between the workstation and the substrate conveying module while simultaneously automatically aligning the workstation with the substrate conveying module, wherein the substrate conveying module has kinematic coupling connecting elements on at least two different side walls, wherein the substrate conveying module has at least one load port for the loading and unloading of said substrates into and from the substrate conveying module, wherein said workstation is configured to perform a function comprising at least one of inspecting, measuring, and processing said substrates, wherein each of said at least two different side walls of said workstation are connectable to each of said at least two different side walls of said substrate conveying module so as to provide for at least four distinct connection configurations between said workstation and said substrate conveying module, and wherein, in each of said at least four configurations, said system is configured to move said substrates from said at least one load port to said workstation to perform said function.

2. The system as defined in claim 1, wherein the workstation comprises a permanently set transfer point for the exchange of the substrates between the substrate conveying module and the workstation.

3. The system as defined in claim 1, wherein the at least two different side walls are adjacent.

4. The system as defined in claim 1, wherein the workstation is configured to exchange said substrates with said substrate conveying module via only one of said at least two different side walls at a time.

5. The system as defined in claim 1, wherein said substrate conveying module is a first substrate conveying module, wherein said system further comprises a second substrate conveying module, wherein each of said substrate conveying modules has kinematic coupling connecting elements on at least two different side walls, wherein each of said substrate conveying modules is connected to said workstation, and wherein said system is configured so that substrates are exchanged from said first substrate conveying module to said workstation, and subsequently from said workstation to said second substrate conveying module.

6. A system made up of at least one substrate conveying module and at least one workstation which has several side walls, substrates being exchangeable between the substrate conveying module and the workstation, wherein the workstation has, on at least two different side walls, kinematic coupling connecting elements that are directly connected to corresponding kinematic coupling connecting elements on at least one side wall of the substrate conveying module to provide for a connection between the workstation and the substrate conveying module, wherein the system is adapted to provide a substantially variable and substantially flexible arrangement of the substrate conveying module with respect to the workstation at a user's site, wherein the substrate conveying module has kinematic coupling connecting elements on at least two different side walls, wherein the substrate conveying module has at least one load port for the loading and unloading of said substrates into and from the substrate conveying module, wherein said workstation is configured to perform a function comprising at least one of inspecting, measuring, and processing said substrates, wherein each of said at least two different side walls of said workstation are connectable to each of said at least two different side walls of said substrate conveying module so as to provide for at least four distinct connection configurations between said workstation and said substrate conveying module, and wherein, in each of said at least four configurations, said system is configured to move said substrates from said at least one load port to said workstation to perform said function.

7. The system as defined in claim 6, wherein the workstation comprises a permanently set transfer point for the exchange of the substrates between the substrate conveying module and the workstation.

8. The system as defined in claim 6, wherein the at least two different side walls are adjacent.

9. The system as defined in claim 6, wherein the workstation is configured to exchange said substrates with said substrate conveying module via only one of said at least two different side walls at a time.

10. The system as defined in claim 6, wherein said substrate conveying module is a first substrate conveying module, wherein said system further comprises a second substrate conveying module, wherein each of said substrate conveying modules has kinematic coupling connecting elements on at least two different side walls, wherein each of said substrate conveying modules is connected to said workstation, and wherein said system is configured so that substrates are exchanged from said first substrate conveying module to said workstation, and subsequently from said workstation to said second substrate conveying module.

11. The system as defined in claim 6, wherein the system is adapted to provide a substantially variable and substantially flexible arrangement of the substrate conveying module with respect to the workstation at an installation location of the system after the substrate conveying module is connected to the workstation.

* * * * *